United States Patent [19]

Cho

[11] 3,909,304

[45] Sept. 30, 1975

[54] METHOD OF DOPING A SEMICONDUCTOR BODY

[75] Inventor: Kon Ho Cho, Lawrenceville, N.J.

[73] Assignee: Western Electric Company, Incorporated, New York, N.Y.

[22] Filed: May 3, 1974

[21] Appl. No.: 466,920

[52] U.S. Cl. .................. 148/1.5; 148/175; 148/187; 357/91

[51] Int. Cl.[2] ......................................... H01L 21/265

[58] Field of Search ......... 148/1.5, 175, 187; 357/91

[56] References Cited

UNITED STATES PATENTS

| | | | |
|---|---|---|---|
| 3,328,216 | 6/1967 | Brown et al. | 148/187 |
| 3,655,457 | 4/1972 | Duffy et al. | 148/1.5 |
| 3,755,001 | 8/1973 | Kool et al. | 148/1.5 |
| 3,764,396 | 10/1973 | Tarui et al. | 148/1.5 |
| 3,793,088 | 2/1974 | Eckton, Jr. | 148/1.5 |
| 3,796,929 | 3/1974 | Nicholas et al. | 148/1.5 X |

*Primary Examiner*—L. Dewayne Rutledge
*Assistant Examiner*—J. M. Davis
*Attorney, Agent, or Firm*—Geoffrey D. Green

[57] ABSTRACT

A doped region is formed in a semiconductor body by implanting ions of dopant atoms into a surface layer of the body and then selectively etching a portion of the implanted surface layer to delineate the desired region. If a buried region is desired, an epitaxial layer is grown over both etched and unetched portions of the implanted surface layer. Before the epitaxial layer is grown, the implanted ions can be diffused farther into the semiconductor body.

7 Claims, 11 Drawing Figures

METHOD OF DOPING A SEMICONDUCTOR BODY

BACKGROUND OF THE INVENTION

1. Field of the Invention

This invention relates to a method of doping a semiconductor body, more particularly, to a method of implanting ions of dopant atoms therein.

2. Prior Art

Ion implantation is being increasingly used in the semiconductor industry to selectively treat portions of semiconductor wafers with dopant ions. With ion implantation, it is possible to form more precisely doped regions in semiconductor wafers than with the widely used gaseous diffusion process, and to avoid certain disadvantages of the diffusion process. A process for fabricating semiconductor devices that includes a diffusion step is disclosed in U.S. Pat. No. 3,328,216 issued to R. S. Brown et al.

A widely used technique for fabricating a semiconductor device comprises first establishing a doped region of high conductivity in a surface layer of a low conductivity silicon wafer, then growing an epitaxial layer of silicon on the surface of the wafer to "bury" the doped region, which is then commonly called a "buried layer." The doped region typically forms one element of the semiconductor device, such as the collector of a transistor. Finally, other elements of the device are fabricated in the grown epitaxial layer.

If the high-conductivity doped region destined to become a buried layer is produced by diffusion, clusters of dopant atoms are likely to form. Such clusters of dopant atoms cause defects known as "rosettes" in the crystal structure of an epitaxial layer grown over the diffused region. Rosettes can render a subsequently fabricated semiconductor device defective, thereby decreasing the yield of the device fabrication process. In contrast, ion implantation does not produce clusters of dopant atoms and rosettes do not appear in the subsequently grown epitaxial layer, thus making the latter process particularly desirable for fabricating a buried layer.

Heretofore, in fabricating a buried layer in a semiconductor wafer by ion implantation, an area to be implanted has typically been defined by means of a "window" in an ion-absorbing mask. A typical mask comprises a silicon dioxide layer, about 10,000 A thick, which is formed on a surface of the wafer and selectively etched to form the window. The window is typically defined using conventional photolithographic techniques. The wafer is then positioned in the target chamber of an electrostatic accelerator wherein ions of selected dopant atoms are accelerated in a vacuum to a high kinetic energy to bombard the wafer. The magnitude of the accelerating voltage determines the depth to which the ions penetrate the wafer. If an ion absorbing mask, such as a patterned layer of silicon dioxide, is used, the mask must be thick enough to prevent accelerated ions from penetrating through the mask into the masked regions of the wafer.

A typical ion implantation process for fabricating buried layers using a silicon dioxide mask is disclosed in U.S. Pat. No. 3,457,632 issued to R. P. Dolan, Jr., et al.

As mentioned, semiconductor devices can be formed in epitaxial layers grown over implanted dopant regions. However, for an epitaxial layer to grow properly, the surface of the wafer must be clean and relatively smooth. Thus, the steps preceding epitaxial layer growth must not leave the surface of the wafer contaminated or pitted.

A particular disadvantage of using a silicon-dioxide ion absorbing mask is that the photolithographic steps used in the fabrication of the mask may leave an undesirable residue that is converted by the subsequent ion implantion into a permanent flaw in the semiconductor wafer. For example, traces of photoresist on a silicon wafer can be converted by the bombarding ions into silicon carbide grains, which remain embedded in the wafer. Such grains can adversely affect subsequent processing, especially epitaxial layer growth.

Another disadvantage of using the silicon-dioxide mask is the fabrication cost involved. The mask must be relatively thick to withstand ion bombardment, requiring (1) a long oxide growth, (2) an etching of the oxide, and (3) a stripping of the oxide. Each of the foregoing adds the potential for a decrease in resultant yield. Thus, both the processing cost and the possible decrease in yield clearly point to the desirability of eliminating the use of the silicon dioxide mask to fabricate ion-implanted buried layers, and this is an object of the present invention.

SUMMARY OF THE INVENTION

This invention relates to a method of doping a semiconductor body, more particularly, to a method of implanting ions of the dopant atoms therein.

According to the invention, ions of dopant atoms are implanted into a semiconductor body to form an ion implanted surface layer. The surface layer is selectively coated with an etch-resistant material in the desired doping pattern. The surface layer is then exposed to an etchant that removes uncoated portions of the surface layer, thus delineating a doped region according to the desired pattern.

These and other aspects of the invention will become apparent from consideration of the drawings and the following descriptions.

DETAILED DESCRIPTION

The present invention is described mainly in terms of ion implanting a semiconductor body that comprises silicon. However, it will be understood that such description is exemplary only and is for purposes of exposition, not limitation. It will be readily appreciated that the inventive concept is equally applicable to semiconductor materials other than silicon, such as other group IV elements, and compounds comprising elements selected from groups III(a)-V(a), e.g., indium antimonide, and from groups II(b)-VI(a) of the Mendeleeve Periodic Table of the Elements as set forth on page B2 of the 45th edition of the *Handbook of Chemistry and Physics* published by the Chemical Rubber Company.

For clarity, the views in the several figures are not to scale, but diagrammatically illustrate the various layers and regions of interest in the semiconductor wafers. Regions having relatively low N-type and P-type conductivity are labeled N and P, respectively. Regions having relatively high N-type and P-type conductivity are labeled N+ and P+, respectively.

Figure 1:
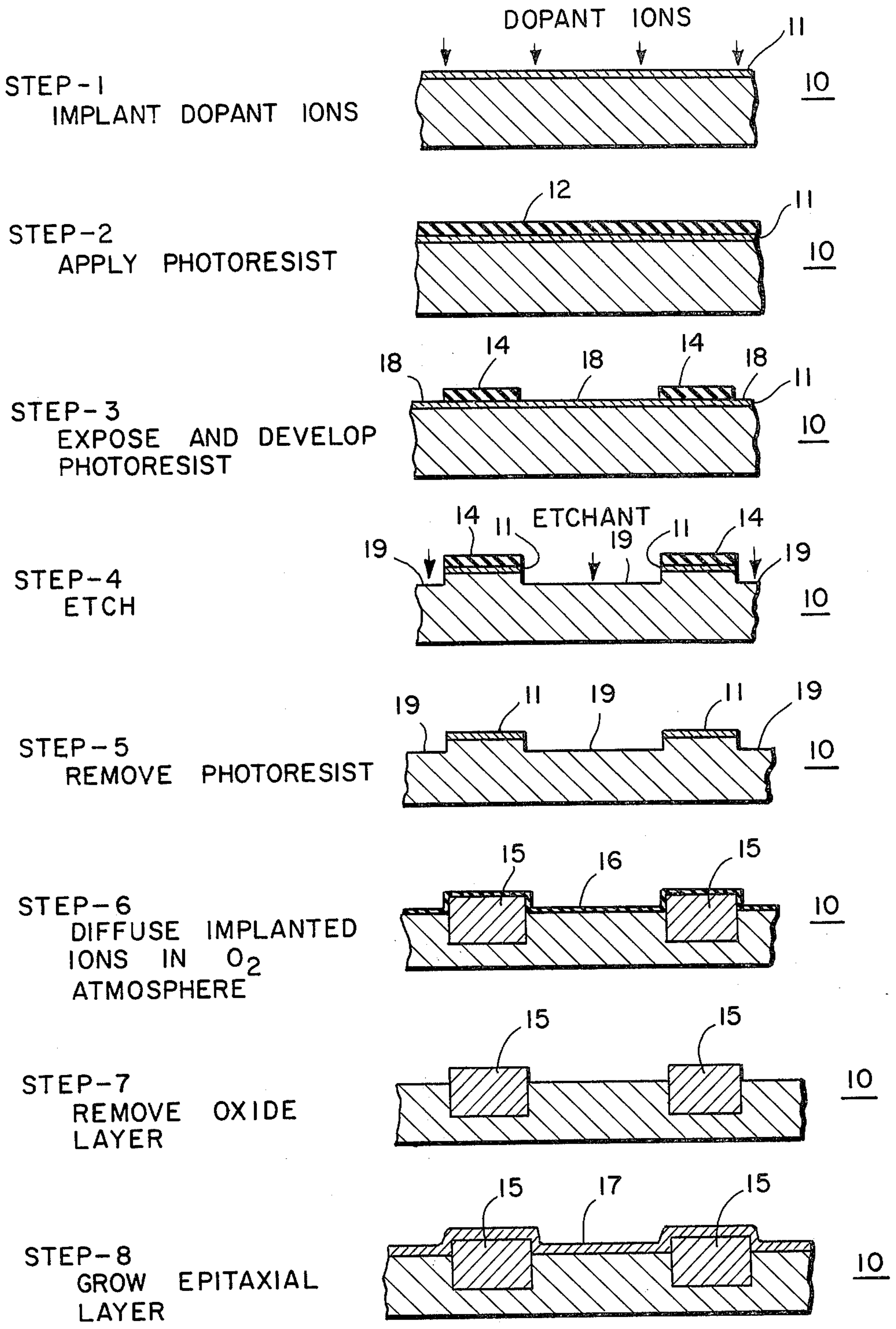
FIG. 1 comprises diagrammatic sectional views of a portion of a semiconductor wafer during the several steps of forming doped regions therein by ion implantation, according to the invention.

Referring to FIG. 1, semiconductor wafer 10 illustratively comprises (111) orientation or (110) orientation P-type silicon, which is boron doped, and has a bulk resistivity between 4 ohm-cm and 15 ohm-cm. Wafer 10 is polished with a commerical polishing compound, such as Monsanto Chemical Corporation Syton R, and the cleaned, employing conventional techniques and reagents, all in a manner well known to those skilled in the art.

During step 1, dopant ions are implanted to form surface layer 11 by mounting wafer 10 as a target in an electrostatic ion implantation apparatus. Such an apparatus typically comprises an ion source, a mass separation magnet for selecting a desired ion species from the source, an ion accelerator for accelerating a beam of the selected ions toward the target, and means for moving the ion beam relative to the target to scan the target with ion beam. If N-type buried layers are to be fabricated, the implanted ions are those of atoms having more than four valence electrons, which leave free electrons as negative conductors in the crystal structure of the semiconductor body when incorporated therein. Some typical N-type ions are arsenic (As+) or antimony (Sb+). If P-type buried layers are to be formed, the implanted ions are those of atoms having less than four valence electrons, which leave deficiencies of electrons, or holes, as positive conductors in the crystal structure of the semiconductor body when incorporated therein. A typical P-tye ion is boron (B+). It is, of course, understood that ions of other elements can be implanted that will yield the desired type of buried layer. Typically, the ions to be implanted are singly charged, and are accelerated to an energy of from 50 Ke-v (50,000 electron-volts) to 150 Ke-v. The implantation is continued until a does from $1 \times 10^{15}$ ions/cm$^2$ to $5 \times 10^{15}$ ions/cm$^2$ is implanted, a preferred dose being $3 \times 10^{15}$ ions/cm$^2$.

In step 2, a photoresist layer 12 is applied to the surface of wafer 10 to cover surface layer 11. If there is a time lapse between steps 1 and 2, or if wafer 10 has been exposed to possible contamination, the cleaning process should be repeated, and wafer 10 should be baked, e.g., at 165°C for one-half hour, to remove all traces of moisture. The photoresist can be positive-working or negative-working photoresist. An example of a suitable, commerically available positive-working photoresist is General Aniline and Film Corporation PR-102 Microline R photoresist. An example of a suitable, commerically available negative-working photoresist is Hunt Chemical Corporation Waycoat R IC-28 negative photoresist. Negative-working photoresists are typically more resistant to strongly acidic etchants, such as a preferred etchant described below.

In step 3, photoresist layer 12 is then conventionally exposed and developed to remove portions thereof, leaving regions of photoresist 14, and exposing regions 18 of implanted surface layer 11.

Referring to step 4, wafer 10 is then exposed to a suitable etchant to remove implanted surface layer 11 in regions 18 that are not protected by photoresist regions 14. The choice of etchant used in step 4 is important, because the resulting etched surface must be suitable for uniform epitaxial layer growth. A suitable etchant is one that etches away a thin layer, about 1500A, from a polished semiconductor surface without leaving surface defects that will interfere with the subsequent growth of a satisfactory epitaxial layer. The wafer 10 is immersed in the selected etchant at a suitable temperature, e.g., within the range from 25°C to the boiling point of the particular etchant selected, for a period of time sufficient to remove surface layer 11 in regions 18. It will be understood that the length of etching time required is dependent upon the etchant employed and the temperature of etching. However, the time and temperature of etching are easily ascertained experimentally by one skilled in the art in the light of the invention disclosed herein.

A first, preferred etchant for use during step 4 comprises 1,000 ml. concentrated aqueous $HNO_3$ (69 weight percent), 10 ml. concentrated aqueous HF (49 weight percent), and 990 ml. deionized water. These volumes can vary ±20%. The wafer 10 is typically immersed in the etchant at 25°C ±1°C for 4 minutes, whereby about 1500A are removed from the implanted surface layer 11 in regions 18.

A particular advantage of following ion implantation with an etching step becomes apparent here. Because implanted silicon typically etches faster than unimplanted silicon, etching of wafer 10 slows after surface layer 11 has been removed, giving a smooth finish to etched regions 19 of wafer 10 that is particularly suitable for subsequent growth of epitaxial layer 17 in step 8.

A second etchant suitable for use in step 4 comprises 33 gm. $CrO_3$, 100 ml. concentrated aqueous HF (49 weight percent) and 900 ml. deionized water, all ±20%. Wafer 10 is typically immersed in this etchant at 25°C ±1°C for 4 minutes, rinsed in deionized water for 5 minutes, immersed for 5 minutes in concentrated aqueous $HNO_3$ (69 weight percent), then rinsed again in deionized water for 5 minutes. The immersion in $HNO_3$ is necessary to remove any traces of chromium ions remaining on wafer 10.

A third etchant for use during step 4 comprises 27.5 gm. $CuSO_4$. $5H_2O$, 5 ml. concentrated aqueous HF (49 weight percent), and 995 ml. deionized water, all ±20%. Wafer 10 is typically immersed in the etchant at 25°C ±1°C for 6 minutes, rinsed for 5 minutes in deionized water, immersed in a solution comprising 1 part concentrated aqueous $HNO_3$ (69 weight percent) and 3 parts deionized water, then rinsed again in deionized water for 5 minutes. The immersion in the $HNO_3$ solution is necessary to remove any traces of copper ions remaining on wafer 10.

During step 5, the photoresist is conventionally removed by means of a suitable solvent for the particular type of photoresist used.

Wafer 10 should again be cleaned, for example, according to the process preceding step 1, before step 6 is performed. In step 6, wafer 10 is subjected to a high temperature in an oxygen atmosphere to diffuse the implanted ions in surface layer 11 farther into the body of wafer 10 to form diffused regions 15. This can be accomplished, for example, by placing wafer 10 in a furnace tube maintained at 1,250°C to 1,280°C for 5 to 8 hours, preferably in a 100% oxygen atmosphere that is being changed at a flow-rate of substantially 3 liters per minute. This step drives the P-N junction resulting from the implantation step from a depth of about 0.1 micron to a depth of about 7 microns, and the oxygen atmosphere forms a thin protective layer 16 of silicon dioxide on the surface of wafer 10. This oxide layer substantially prevents autodoping, that is, contamination of unimplanted regions of wafer 10 by dopant atoms driven out from the implanted regions during diffusion. However, oxide layer 16 is only about 3000A thick, much thinner than would be necessary to mask ions being implanted, so its removal in the next step is not so difficult or critical as the removal of a thicker silicon dioxide ion-blocking mask. The sheet resistivity in the resulting diffused regions is about 15 to 20 ohms per square, which is much lower than in the untreated regions of wafer 10.

In step 7 oxide layer 16 is removed by immersing wafer 10 in concentrated aqueous HF (49 weight percent) for 5 minutes followed by rinsing in deionized water and spinning until dry.

In step 8 epitaxial layer 17 is grown over wafer 10 using conventional techniques well known in the art. Where silicon epitaxy is desired, a typical epitaxial growth process comprises placing wafer 10 in an epitaxial reactor at 1,100°C for 10 minutes wherein $H_2$ gas is bubbled through SiCl containing $AsH_3$. The $AsH_3$ provides the arsenic dopant ions to create the N-type epitaxial layer 17. If a semiconductor wafer is desired having both P-type and N-type buried layers, the wafer 10 is first implanted with N-type dopant ions, such as arsenic ions, as described above in FIG. 1, steps 1–7. Then, the wafer can be implanted with P-type dopant ions, such as boron ions, in another similar series of steps before the epitaxial layer is fabricated.

Figure 2:
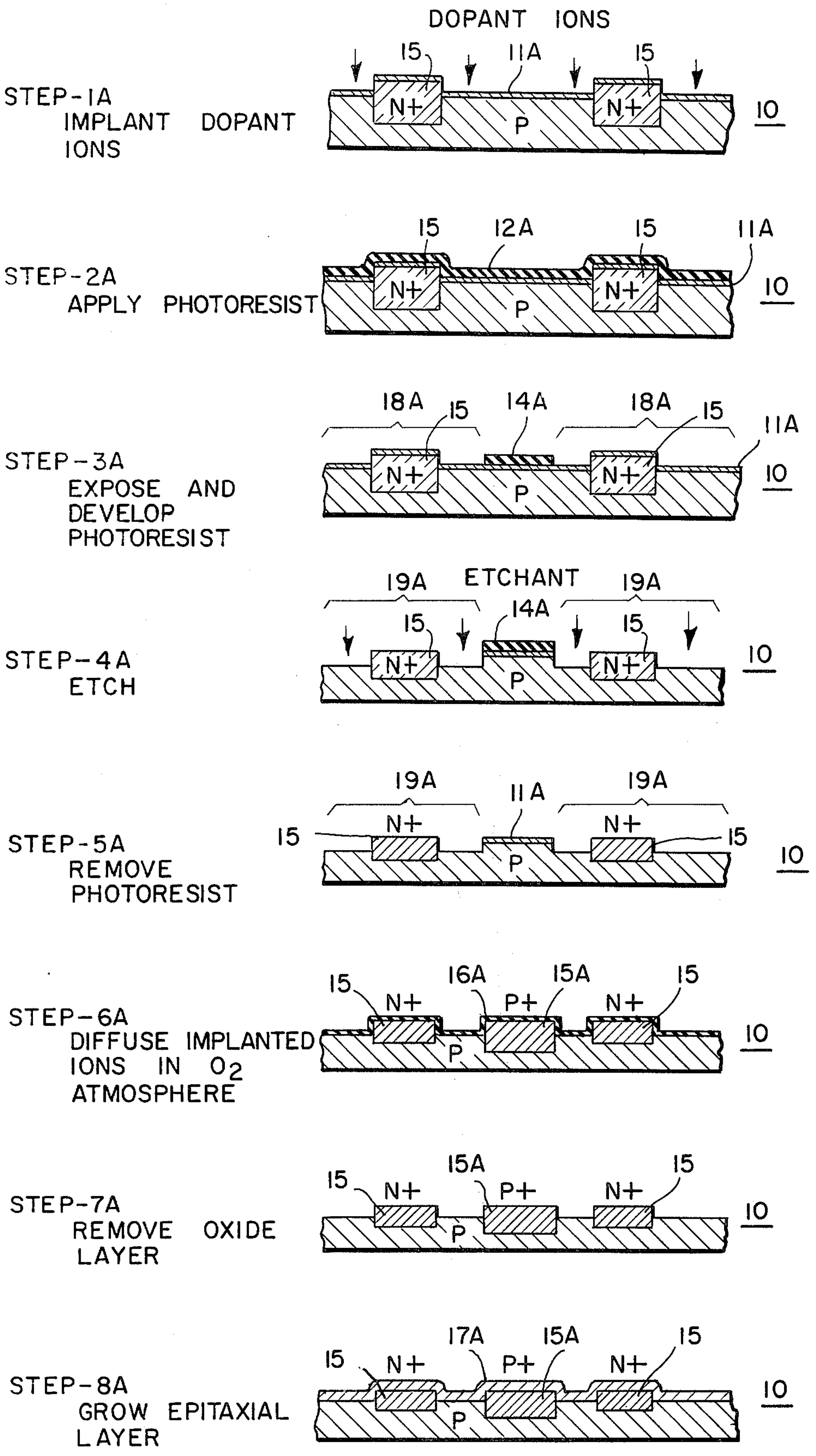
FIG. 2 comprises diagrammatic sectional views of a portion of a semiconductor wafer during certain steps of forming both N-type and P-type doped regions therein, according to the invention.

FIG. 2 shows sectional views of a semiconductor wafer in which both P-type and N-type buried layers are being formed. Step 1A illustrates a wafer 10 having regions 15 of N-type conductivity resulting from the wafer being subjected to steps 1–7 of FIG. 1 with N-type ions being implanted in step 1. During step 1A, a surface region 11A of P-type dopant ions is implanted in the entire surface of wafer 10, covering both the N-type regions 15 and the etched regions of wafer 10. Steps 2A through 7A are analogous to steps 2 through 7 in FIG. 1, described above, in that regions of P-type dopant ions are defined and diffused to form P-type regions 15A. In step 2A, a photoresist layer 12A is applied to the entire surface of wafer 10. In step 3A, photoresist layer 12A is exposed and developed to remove portions thereof, leaving regions of photoresist 14A, and exposing regions 18A of implanted surface layer 11A. In step 4A, wafer 10 is exposed to an etchant that removes exposed regions 18A leaving etched surfaces 19A. In step 5A, photoresist regions 14A are removed. In step 6A, wafer 10 is subjected to a high temperature in an oxygen atmosphere to diffuse the implanted ions in the remaining portion of surface layer 11A farther into the body of wafer 10 to form diffused regions 15A. This step will also cause an insubstantial further diffusion of the ions implanted in N-type regions 15. As a result of step 6A, a silicon dioxide layer 16A forms on the exposed surface of wafer 10. In step 7A, silicon dioxide layer 16A is removed. In step 8A, epitaxial layer 17A is grown over the surface of wafer 10 to cover diffused regions 15 and 15A and the etched regions of wafer 10. Again, epitaxial layer 15A is low-conductivity N-type silicon. Clearly the above order could be reversed and the P-type regions 15A implanted before the N-type regions 15.

Figure 3:
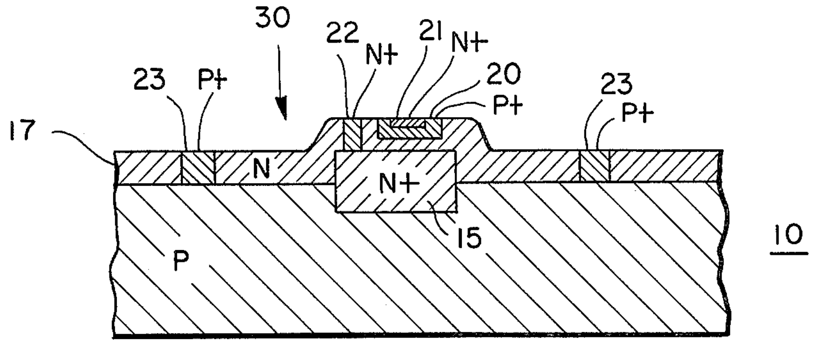
FIG. 3 comprises a diagrammatic sectional view of a portion of a semiconductor wafer having an N-type doped region fabricated therein, according to the invention, and wherein an NPN transistor has also been fabricated.

After an epitaxial layer 17 or 17A is grown, according to the process described with reference to FIGS. 1 and 2, desired circuit elements can be fabricated in the epitaxial layer by standard techniques. For example, FIG. 3 shows a portion of a silicon wafer 10 in which an NPN transistor has been fabricated in epitaxial layer 17 overlying an N+ buried layer 15 fabricated by the process described above. The transistor elements comprise base region 20, which is diffused with dopant atoms to become P+; emitter region 21, which is diffused with dopant atoms to become N+; and deep-diffused collector region 22 which is diffused with dopant atoms to become N+. Metallic pads for external connection (not shown) are subsequently deposited on the surfaces of emitter region 21, base region 20, and deep-diffused collector region 22. Isolation regions 23, which are diffused with dopant atoms to become P+, extend through epitaxial layer 17 to isolate each transistor 30 from other circuit elements that may be present in epitaxial layer 17.

The diffusion steps necessary to fabricate the various elements of transistor 30 described above are well known in the art. Each diffusion step typically comprises growing a silicon dioxide layer over the surface of epitaxial layer 17, selectively etching windows in the silicon dioxide layer by photolithographic techniques where diffusion is desired, and diffusing dopant atoms into epitaxial layer 17 in a gaseous diffusion furnace.

Figure 4:
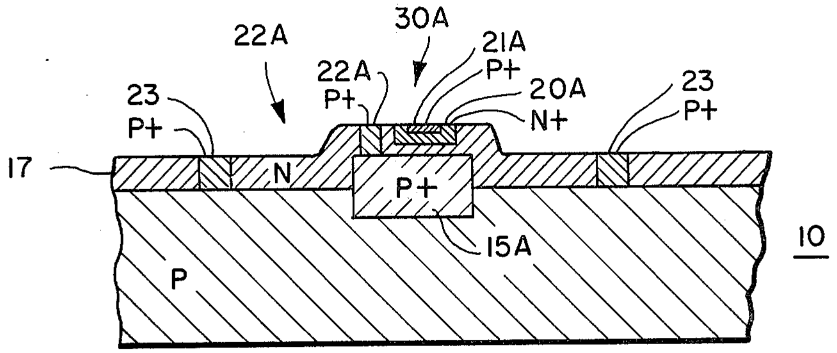
FIG. 4 comprises a diagrammatic sectional view of a portion of semiconductor wafer having a P-type doped region fabricated therein, according to the invention, and wherein a PNP transistor has also been fabricated.

FIG. 4 shows a portion of a silicon wafer in which a PNP transistor 30A has been fabricated in epitaxial layer 17. The elements of transistor 30A are analogous to those of transistor 30 described in conjunction with FIG. 3, except that the conductivities of the elements are opposite; that is, buried layer 15A is P+, base region 20A is N+, emitter region 21A is P+, and deep-diffused collector region 22A is P+.

The multiple silicon dioxide layer-growing and window-cutting steps revealed in prior art techniques cause the final resulting surface of epitaxial layer 17 to become irregular over a device such as transistor 30 in FIG. 3. Because metallic connection paths to the elements of transistor 30 must be subsequently applied to this surface, over an oxide-insulating layer, these irregularities can cause difficulties by structurally stressing and weakening the metallic connection paths. Therefore, it is desirable to minimize the number and severity of the surface irregularities. Such surface irregularities have heretofore been particularly troublesome in complementary circuits having fully diffused buried layers where both NPN and PNP devices are fabricated in the same epitaxial layer, because of the large number of separate diffusion steps, each with its unique silicon dioxide mask, that have been necessary. One advantage of the present invention is that fewer irregularities result in the final surface of a complementary circuit wherein both N+ and P+ buried layers are fabricated as described in FIG. 2.

EXAMPLE I

In the process as described in FIG. 1, steps 1–8, a number of boron-doped P-type silicon wafers nominally 2 inches in diameter and having (100) crystal orientation were chemically polished with a commercially available polishing agent. The polished wafers were then cleaned by immersing the wafer in a solution containing 1 part 30% $NH_4OH$ (aqueous), 1 part 30% $H_2O_2$ (aqueous), and 4 parts deionized water for 10 minutes with the solution at 80°C; rinsing the wafer for 5 minutes in deionized water; immersing the wafer in a solution containing 1 part concentrated aqueous HCl (37 weight percent), 1 part 30% $H_2O_2$ (aqueous), and 4 parts deionized water for 10 minutes with the solution at 80°C; rinsing the wafers for 5 minutes in deionized water; then drying the wafers by spinning. The cleaned wafers were implanted with As+ ions at 150 Ke-v to obtain a does of $3 \times 10^{15}$ ions/cm$^2$, and then were again cleaned by repeating the above cleaning step and baked to remove any mositure therefrom. The baked wafers were patterned with a commerically obtained positive-working photoresist to form an etch-resistant coating corresponding to desired dopant layers. The coated wafers were then etched with the first, preferred etchant, according to the above description, at 25°C for 4 minutes; rinsed in deionized water for 5 minutes; cleaned; subjected to the drive-in diffusion step at 1270°C +5°C for 5 hours; stripped of the resulting $SiO_2$ layer; and subjected to an epitaxial layer growing step, using a conventional technique wherein $H_2$ gas was bubbled through $SiCl_4$ containing $AsH_3$. The $AsH_3$ provides the dopant ions to create the N-type epitaxial layer 17. This step results in the growth of an epitaxial layer 17 of about 10 microns thick having a bulk resistivity of about 2 to 4 ohm-cm.

EXAMPLE II

The procedure of Example I was repeated except that the wafers were patterned with a commerical negative-working photoresist and etched with the second etchant, according to the above description.

EXAMPLE III

The procedure of Example I was repeated except the silicon wafers had (111) crystal orientation and were implanted with Sb+ ions at 150 Ke-v to obtain a dose of $3 \times 10^{15}$ ions/cm$^2$, and were subjected to the drive-in diffusion step at 1,250°C ±5°C for 7 hours.

What is claimed is:

1. A method of forming a doped region in a semiconductor body, which comprises:

implanting ions of dopant atoms into a surface of the semiconductor to form an implanted surface layer, selectively coating said implanted surface with an etch-resistant pattern corresponding to the desired doped region, and etching the uncoated portion of said coated surface to a depth where substantially all implanted ions are removed to delineate the doped region, and to leave the resulting etched surface substantially free from defects.

2. The method of claim 1 which further comprises:

removing the etch-resistant pattern, and growing a continuous epitaxial layer on said semiconductor surface having the doped region to form a buried doped region.

3. The method of claim 2, which further comprises:

before the epitaxial layer growing step, diffusing said implanted ions farther into the semiconductor body.

4. In a method of forming a buried doped region in a semiconductor body, comprising the steps of forming a surface layer of dopant atoms in the semiconductor, selectively etching away a portion of the surface layer to delineate the doped region, and diffusing the remaining dopant atoms farther into the semiconductor, the improvement which comprises:

in the forming step, implanting ions of the dopant atoms into a surface of the semiconductor body to form the surface layer of dopant atoms;

in the selective etching step, etching away the portion of the surface layer to a depth where substantially all implanted ions are removed to leave the resulting etched surface substantially free from defects; and after the diffusing step, growing a continuous epitaxial layer on said semiconductor surface having the delineated doped region.

5. In a method of forming a buried doped region in a semiconductor body comprising the steps of forming a layer of implanted ions of dopant atoms in the semiconductor and growing an epitaxial layer on at least the implanted ion layer, the improvement which comprises:

in the forming step, implanting the ions into a surface layer of the semiconductor; and selectively etching the surface layer to a depth where substantially all implanted ions are removed to leave the resulting etched surface substantially free from defects and to delineate the doped region.

6. The method of claim 5 which further comprises:

before the epitaxial layer growing step, diffusing the implanted ions farther into the semiconductor body.

7. A method of forming buried doped regions in a semiconductor body, wherein a first doped region comprises atoms of a first conductivity type and a second doped region comprises atoms of a second conductivity type, comprising the steps of:

implanting ions of dopant atoms of the first conductivity type into a selected surface of the semiconductor to form a first implanted surface layer, selectively coating the selected surface with a first etch-resistant pattern corresponding to the desired first doped region, exposing the coated surface to an etchant to delineate the first doped region, removing the first etch-resistant pattern, diffusing the implanted ions farther into the body, implanting ions of dopant atoms of the second conductivity type into the selected surface of the semiconductor to form a second implanted surface layer, selectively coating the selected surface with a second etch-resistant pattern corresponding to the desired second doped region, exposing the coated surface to an etchant to delineate the second doped region, removing the second etch-resistant layer, diffusing the implanted ions farther into the body, and growing a continuous epitaxial layer on both a portion of the selected surface of the semiconductor and the first and second doped regions.

* * * * *

UNITED STATES PATENT OFFICE
CERTIFICATE OF CORRECTION

Patent No. 3,909,304 Dated September 30, 1975

Inventor(s) KON HO CHO

It is certified that error appears in the above-identified patent and that said Letters Patent are hereby corrected as shown below:

In the specification, Column 1, lines 42-43, "seniconductor" should read --semiconductor--. Column 3, lines 20-21, "and the cleaned," should read --and then cleaned,--; line 32, "with ion beam." should read --with the ion beam.--; line 43, "P-tye" should read --P-type--; line 49, "does" should read --dose--. Column 7, line 19, "does" should read --dose--; line 29, "+5°C" should read --±5°C--.

Signed and Sealed this

*thirtieth* Day of *December 1975*

[SEAL]

*Attest:*

RUTH C. MASON
*Attesting Officer*

C. MARSHALL DANN
*Commissioner of Patents and Trademarks*